(12) United States Patent
Ikeda

(10) Patent No.: US 6,194,318 B1
(45) Date of Patent: Feb. 27, 2001

(54) MANUFACTURING MULTIPLE LAYERED STRUCTURES OF LARGE SCALE INTEGRATED SEMICONDUCTOR DEVICES

(75) Inventor: Yukio Ikeda, Shiga (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/309,252

(22) Filed: May 10, 1999

(30) Foreign Application Priority Data

May 11, 1998 (JP) .................................................. 10-126928

(51) Int. Cl.[7] .................................................. H01L 21/311
(52) U.S. Cl. .......................................... 438/699; 438/702
(58) Field of Search .......................... 257/529; 438/690, 438/691, 700, 694, 699, 702, 717, 735–744

(56) References Cited

U.S. PATENT DOCUMENTS

| | | | |
|---|---|---|---|
| 5,729,041 | * 3/1998 | Yoo et al. .............................. | 257/529 |
| 5,965,927 | * 10/1999 | Lee et al. .............................. | 257/529 |
| 5,989,784 | * 11/1999 | Lee et al. .............................. | 430/316 |
| 6,046,488 | * 4/2000 | Kawasaki et al. ..................... | 257/529 |
| 6,054,340 | * 4/2000 | Mitchell et al. ....................... | 438/132 |

* cited by examiner

*Primary Examiner*—Benjamin L. Utech
*Assistant Examiner*—Kin-Chan Chen

(57) ABSTRACT

A process of making a multiple layered structure comprises etching at least partially a portion of dielectric material above a fuse upon etching at least one hole to establish electrical interconnection between the adjacent two wiring layers separated by the dielectric material. After forming a protective film, a portion of the protective film above the fuse is etched upon etching at least one aperture to expose a pad of one of the wiring layers underneath the protective film. The remaining material above the fuse is removed by etching using the same mask as etching the at least one aperture through the protective film. Electrical testing is conducted using an electrical probe at the pad. In response to result of the electrical testing, laser energy is focused to a target fuse.

10 Claims, 4 Drawing Sheets

MANUFACTURING MULTIPLE LAYERED STRUCTURES OF LARGE SCALE INTEGRATED SEMICONDUCTOR DEVICES

BACKGROUND OF THE INVENTION

1. Field of the Invention

The present invention relates to manufacture of semiconductor devices. More particularly, this invention relates to processes of making multiple layered wiring structures for large scale integrated (LSI) semiconductor devices. Specifically, the processes employ fusible links (or fuse links). The use of the fuse links is a known redundancy technique utilized in most LSI semiconductor devices.

2. Description of the Related Art

Referring to FIG. 7, a known process is explained. A semiconductor substrate 1 has a plurality of wiring layers, as many as 3 wiring layers in this example, over at least one impurity concentrated region (not shown). The wiring layers include a layer functioning as a gate (not shown) of a transistor and a resistor, and a layer interconnecting the gate, the resistor and an appropriate active region of the semiconductor substrate. Each wiring layer is separated from the adjacent wiring layer by an insulator film. The gate has fuse links embedded in an insulator film 3. Only one of such fuse links is shown at 2 as embedded in the insulator film 3. Chemical and mechanical polishing, commonly referred to as "CMP", has been used to smooth a surface of the insulator film 3. The surface of the insulator film 3 is parallel to the substrate surface and the film thickness is about 1.0 $\mu$m. The wires are produced by forming a mask or positioning a mask over the surface of the insulator film 3 and depositing a metal such as Aluminum (Al). The metal condenses at openings in the mask to form wires and form conductive vias in holes formed through the insulator film to establish electrical connections with a conductive layer underneath. The mask covers area portions in which the fuse links are provided. The wires form a first wiring layer 34. The thickness of wires of the first wiring layer 34 is about 1.03 $\mu$m. Dielectric material is deposited on the first wiring layer 34 and the remaining area portion of the surface of the insulator film 3. CMP is used to polish a surface of the deposited dielectric material until the dielectric material as thick as about 1.0 $\mu$m is left above the first wiring layer 34, thus providing an insulator film 35. Holes, only one being shown, are formed through the insulator film 35 above the first wiring layer 34 and plugs, only one being shown at 37, fill the holes in contact with the wires of the first wiring layer 34. A second wiring layer 38 is formed by Al deposited on the surface of the insulator film 35. The thickness of the wires of this wiring layer 38 is about 1.6 $\mu$m. A protective material is deposited by plasma CVD to a thickness of 0.8 $\mu$m to form a protective film 19 over the second wiring layer 38 and the remaining area portion of the surface of the insulator film 35. A photoresist 20 is used as a mask positioning over the protective film 19. The photoresist 20 has first openings above pads of the second wiring layer 38 and second openings above the fuse links 2. Using the photoresist 20 as the mask, dry etching is employed to remove or etch portions of the protective film 19 to expose the pads of the second wiring layer 38 and remove portions of the protective film 19 above the fuse links 2. During this dry etching, portions of the insulator film 35 above the fuse links 2 are removed and portions of the insulator film 3 above the fuse links 2 are thinned to a thickness of about 0.8 $\mu$m above each fuse link 2 to form fuse blow windows. Electric testing is performed using electrical probes in contact with the pads to measure electrical properties of the pads. In response to result of the testing, an appropriate fuse link may be blown by focusing laser energy on the target fuse. The fuse blow window is opened by thinning dielectric material above each fuse link 2 to enhance the probability of completely opening the fuse link upon a laser strike. In the process discussed above, the photoresist 20 can withstand during etching the dielectric material above the fuse link 2. However, the photoresist 20 may not withstand if the thickness of dielectric material above each fuse link increases further. LSI semiconductor devices may include more than 2 wiring layers and as many as 4 wiring layers separated by insulator (dielectric) films. The known process is not appropriate to manufacturing such LSI semiconductor devices.

Therefore, a need remains to provide a process of making a multiple layered structure of a LSI semiconductor device to allow the use of a mask for dry etching a protective film in thinning the material above a fuse link to provide an appropriate fuse blow window.

SUMMARY OF THE INVENTION

According to one aspect of the present invention, there is provided a process of making a multiple layered wiring structure, comprising providing at least one fuse within an area portion of a film over a substrate;

forming a plurality of wiring layers over the remaining area portion of said film, such that each said wiring layer is separated by an insulator film;

forming, by etching, at least one hole through said insulator film for establishing an electrical interconnection between the adjacent two wiring layers separated by said insulator film;

removing, by etching, at least partially said insulator film at a portion above said fuse upon said forming at least one hole;

forming a protective film over said plurality of wiring layers;

forming, by dry etching using a photoresist as a mask, at least one aperture through said protective film to expose a pad of the adjacent wiring layer beneath said protective film;

removing said protective film at a portion above said fuse upon said forming said at least one aperture through said protective film;

conducting testing by contacting an electrical probe with said pad; and focusing laser energy to said fuse in response to result from said conducting testing.

DESCRIPTION OF THE PREFERRED EMBODIMENT

Figure 7:
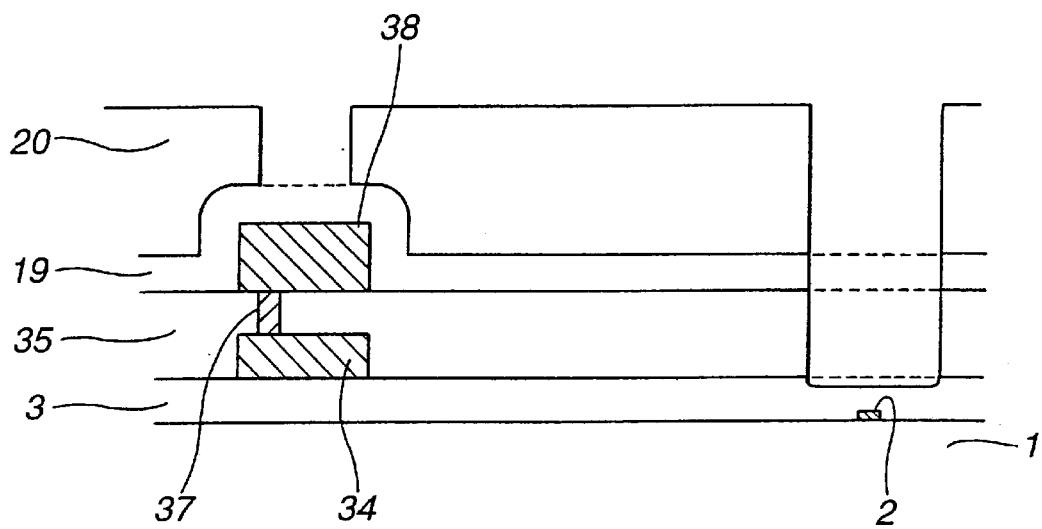
FIG. 7 is a cross-sectional view of the before discussed prior art showing a fuse in a predetermined film on a substrate, a first wiring layer, a first insulator film, a second wiring layer, a protective film and a photoresist, after a portion of the protective film above the fuse and the material underneath have been removed upon etching an aperture through the protective film to expose a pad of the second wiring layer.
Figure 8:
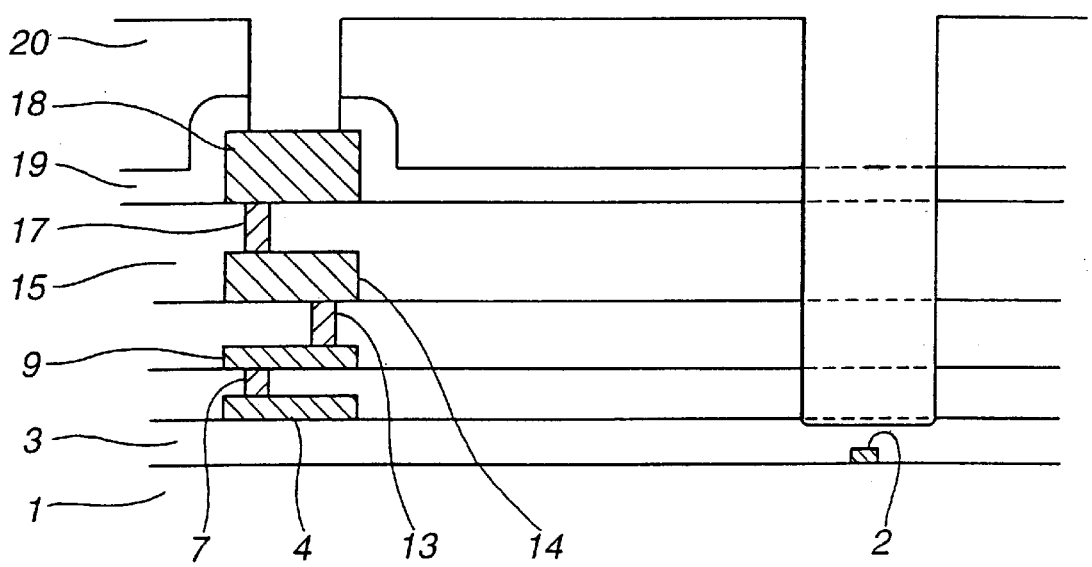
FIG. 8 is a cross-sectional view of a less preferred embodiment showing a fuse in a predetermined film on a substrate, a first wiring layer, a first insulator film, a second wiring layer, a second insulator film, a third wiring layer, a third insulator film, a fourth wiring layer, a protective film and a photoresist, after the remaining material above the fuse has been removed after removal of a portion of the protective film above the fuse.

Before entering into description on the preferred embodiment, an explanation is made on the less preferred embodiment shown in FIG. 8. FIG. 8 shows a four wiring layered structure of a LSI semiconductor device. The same reference numerals as used in FIG. 7 are used in FIG. 8 to designate counterparts.

A first wiring layer 4 is formed by depositing Aluminum on a surface of an insulator layer 3 in which fuse link 2 is embedded. The thickness of wires of this layer 4 is 0.53 μm. Similarly to the structure of FIG. 7, the wiring layer 4 is electrically connected to a conductive layer underneath. The wiring layer 4 extends over the remaining area portion of a surface of the insulator film 3 excluding area portion in which fuse link 2 is provided. Film is formed on the wiring layer 4 and the remaining area portion of the surface of the insulator film 3. CMP is used to polish a surface of the film until the film as thick as about 0.6 μm is left above the first wiring layer 4 to provide an insulator film 5. A second wiring layer 9 is formed by Al deposited on the surface of the insulator film 5. The thickness of the wires of the second wiring layer 9 is 0.5 μm. With plugs 7 in holes formed through the insulator film 5, the second wiring layer 9 is electrically connected with the first wiring layer 4. The second wiring layer 9 does not overlap the area portion in which fuse link 2 is provided. Film is formed on the second wiring layer 9 and the surface of the insulator film 5. CMP is used to polish a surface of the film until the film as thick as about 1.0 μm is left above the second wiring layer 9 to provide an insulator film 11. A third wiring layer 14 is formed by Al deposited on the surface of the insulator film 11. The thickness of the wires of the third wiring layer 14 is 1.0 μm. The third wiring layer 14 does not overlap the area portion in which fuse link 2 is provided. With plugs 13 in holes formed through the insulator film 11, the third wiring layer 14 is electrically connected with the second wiring layer 9. Film is formed on the third wiring layer 14 and the surface of the insulator film 11. CMP is used to polish a surface of the film until the film as thick as about 1.0 μm is left above the third wiring layer 14 to provide an insulator film 15. A fourth wiring layer 18 is formed by Al deposited on the insulator film 15. The thickness of the wires of the fourth wiring layer 18 is 1.6 μm. The fourth wiring layer 18 does not overlap the area portion in which fuse link 2 is provided. With plugs 17 in holes formed through the insulator film 15, the fourth wiring layer 18 is electrically connected with the third wiring layer 14. A protective material is deposited to a thickness of 0.8 μm to form a protective film 19 over the fourth wiring layer 18 and the surface of the insulator film 15. In this multiple layered structure, the thickness of the dielectric material, including the protective layer 19, above the fuse link 2 exceeds 6 μm. A photoresist 20 is used as a mask positioning over the protective film 19 for dry etching to expose pads on the fourth wiring layer 18. With this photoresist 20, it is very difficult to over etch the material above the fuse link 2 because time required for etching becomes too long for the photoresist to withstand. Thus, there exists a need to interrupt the over etch operation to form a new photoresist and to resume the over etch operation until the material above the fuse link 2 is thinned sufficiently to form an appropriate fuse blow window.

The following fabrication sequences and the related diagrams illustrate the formation of a multiple layered structure employing a redundancy technique.

FIGS. 1 through 6 demonstrate the fabrication of the simplest multiple layered structure having a semiconductor substrate 1 and a fuse link 2.

Figure 1:
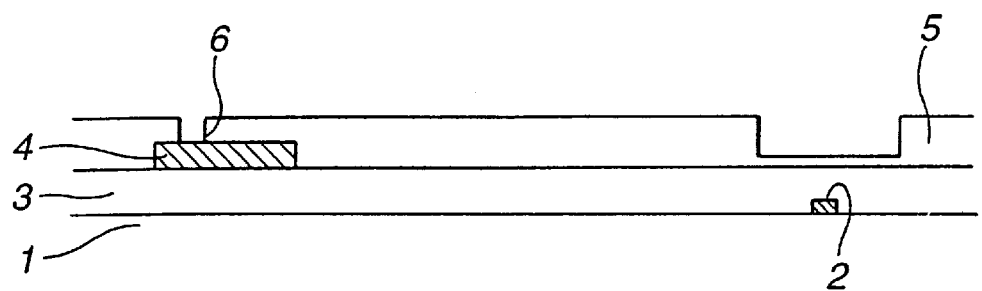
FIG. 1 is a cross-sectional view of one preferred embodiment showing a fuse in a predetermined film on a substrate, a first wiring layer and a first insulator film after a portion of the insulator film above the fuse has been partially removed upon etching a hole through the insulator film.

Referring to FIG. 1, the semiconductor substrate 1 is formed with at least one impurity concentration region (not shown). The substrate 1 is a multiple layered structure including a plurality, three in this example, of wiring layers over the impurity concentration region. The wiring layers include a wiring layer functioning as a gate (not shown) of a transistor or a resistor and another wiring layer interconnecting the gate, the resistor and the associated active region or regions within the semiconductor substrate 1. The gate is associated with fuse links, only one being shown at 2. The fuse link 2 is embedded in an insulator film 3 within a predetermined area portion thereof. The insulator film 3 is formed on a surface of the substrate 1. CMP is used to smooth a surface of the insulator film 3. The surface of the insulator film 3 extends over the substrate surface in parallel relationship. The film thickness of the insulator film 3 is about 1.0 μm. Formed on the insulator film 3 is a first wiring layer 4. The first wiring layer 4 is formed by depositing Al on the surface of the insulator film 3. The deposited Al may contain Cu. The thickness of wires of the first wiring layer 4 is 0.53 μm. The first wiring layer 4 is electrically connected with a conductive layer underneath (not shown). The first wiring layer 4 does not overlap the predetermined area portion of the insulator film 3 in which the fuse link 2 lies. A three-layered insulator film is deposited on the first wiring layer 4 and the surface of the insulator film 3. The three layers include a first layer of $SiO_2$ deposited by plasma CVD. This layer may be referred to as "P—$SiO_2$ layer". Formed on the P—$SiO_2$ layer is a second layer of TEOSNSG deposited within a gas containing $O_3$. This layer may be referred to as "$O_3$-TEOSNSG layer". Formed on the $O_3$-TEOSNSG layer is another P—$SiO_2$ layer as a third layer. The total thickness of this three-layered film is about 1.6 μm. CMP is used to polish a surface of the deposited three-layered film until the material as thick as about 0.6 μm is left above the first wiring layer 4 to provide an insulator film 5. A photoresist mask, not shown, is positioned over a surface of the insulator film 5. The mask has at least one first opening above the first wiring layer 4 for forming a through hole 6 and at least one second opening above the fuse link 2 for thinning the insulator film 5. By anisotropic dry etching technique using the mask, the hole 6 is formed through the insulator film 5 and a portion of the insulator film 5 above the fuse link 2 is thinned. The portion of the insulator film 5 above the fuse link 2 is over etched until the insulator film 5 above the fuse link 2 is removed almost completely or thinned satisfactorily. In this example, the portion of the insulator film 5 above the fuse link 2 has been removed to a depth as deep as 0.9 to 1.0 μm. The first opening in the mask is dimensioned to have 0.5 μm□, and the second opening is dimensioned to have 3 μm□.

Figure 2:
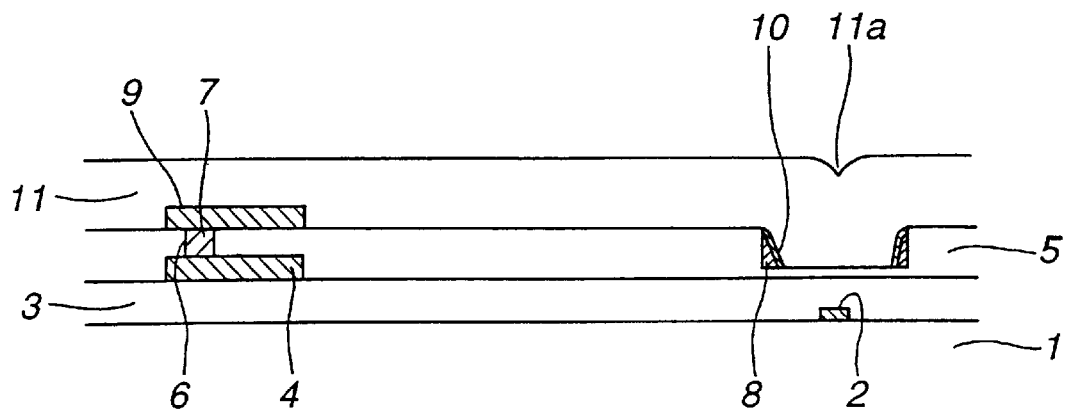
FIG. 2 is a cross-sectional view showing the structure of FIG. 1, with a second wiring layer and a second insulator film.

Referring to FIG. 2, a backing layer (not shown) is formed over the entire surface of the structure of FIG. 1 by sputtering. The backing layer is a Ti/TiN layered structure. A Wolfram (W) film is formed over entire surface of the backing layer to fill the hole 6 by chemical vapor deposition (CVD). The thickness of the W film is about 0.5 μm. All of W from the flat portions of the insulator film 5 is removed by etch back technique to provide a plug 7 filling the hole 6. After this removal of W, a small amount of W may be left as a thin sidewall 8 along sidewalls of the recessed portion of the insulator film 5 above the fuse link 2. Removal of W from a bottom of the recessed portion is complete. A second Al wiring layer 9 is formed on the surface of the insulator film 5 in a predetermined pattern. The second wiring layer 9 includes an Al layer interposed between upper and lower TiN layers (not shown). The second wiring layer 9 does not overlap the predetermined area portion in which the fuse link 2 lies. Via the plug 7, the second wiring layer 9 is electrically connected with the first wiring layer 4. After this patterning operation, a small amount of Al may be left as a sidewall 10 along the sidewalls of the recessed portion. Removal of Al from the bottom of the recessed portion is complete. A three-layered insulator film is deposited on the second wiring layer 9 and the surface of the insulator film 5. The three layers include a first P—SiO$_2$ layer, a second O$_3$-TEOSNSG layer and a third P—SiO$_2$ layer. The total thickness of this three-layered film is about 1.9 μm. CMP is used to polish a surface of the deposited three-layered film until the material as thick as about 1.0 μm is left above the second wiring layer 9 to provide an insulator film 11. A surface of this insulator film 11 is slightly recessed at 11a above the fuse link 2 reflecting the recessed portion underneath.

Figure 3:
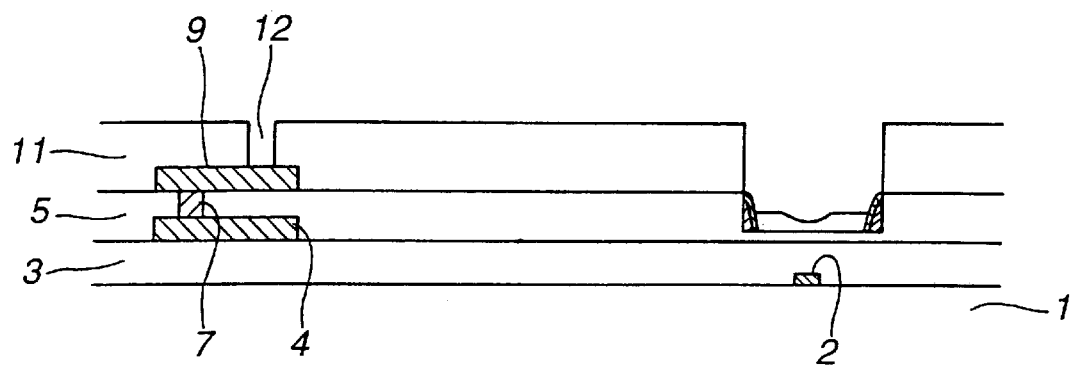
FIG. 3 is a cross-sectional view showing the structure of FIG. 2, after a portion of the second insulator film above the fuse has been partially removed upon etching a hole through the second insulator film.

Referring to FIG. 3, a photoresist mask, not shown, is positioned over a surface of the insulator film 11. The mask has at least one first opening above the second wiring layer 9 for forming a through hole 12 and at least one second opening above the fuse link 2 for thinning the insulator film 11. By anisotropic dry etching technique using the mask, the hole 12 is formed through the insulator film 11 and a portion of the insulator film 11 above the fuse link 2 is thinned. The portion of the insulator film 11 above the fuse link 2 is over etched until the insulator film 11 above the fuse link 2 is removed almost completely or thinned satisfactorily. In this example, the portion of the insulator film 11 above the fuse link has been removed to a depth as deep as 1.5 to 1.8 μm. The first opening in the mask is dimensioned to have 0.5 μm□, and the second opening is dimensioned to have 3 μm□.

Figure 4:
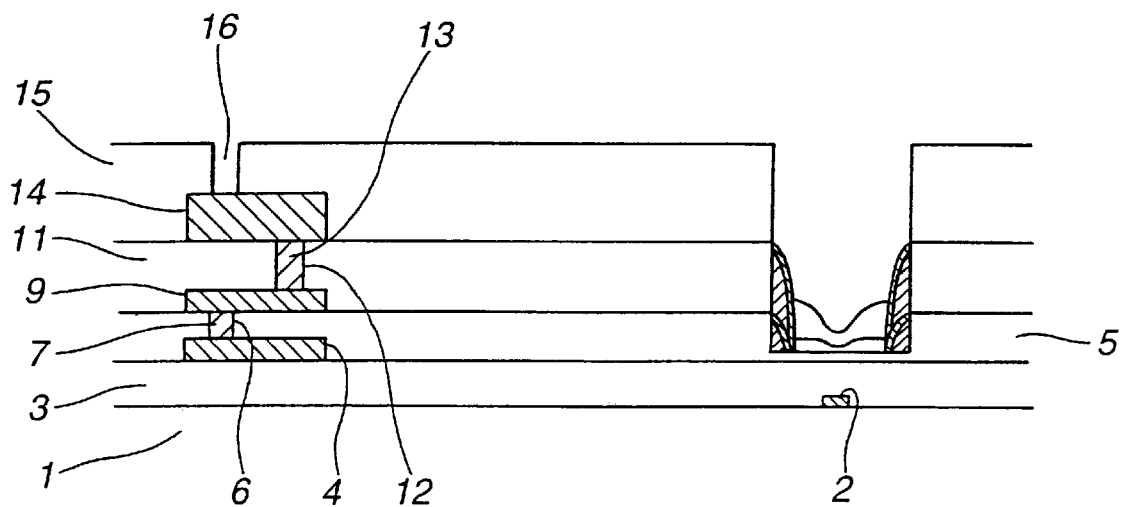
FIG. 4 is a cross-sectional view showing the structure of FIG. 3, with a third wiring layer and a third insulator film, after a portion of the third insulator film above the fuse has been partially removed upon etching a hole through the third insulator film.

Referring to FIG. 4, a plug 13 filling the hole 12 is formed in the same manner as the formation of the plug 7. A third Al wiring layer 14 is formed in the same manner as the formation of the second wiring layer 9. An insulator film 15 is formed in the same manner as the formation of the insulator film 11. A through hole 16 is formed above the third wiring layer 14 and a portion of the insulator film 15 above the fuse link 2 is thinned in the same manner as the formation of the through hole 12 and the thinning of the insulator film 11 above the fuse link 2. The thickness of the third wiring layer 14 is 1.0 μm. The total thickness of the insulator film 15 prior to CMP operation is about 2.4 μm. After the CMP operation, the thickness of the insulator film 15 above the third wiring layer 14 is about 1.0 μm. The portion of the insulator film 15 above the fuse link 2 is over etched to a depth as deep as 1.5 to 1.8 μm upon etching the through hole 16. A photoresist mask that is used for this etching operation has at least one first opening for formation of the through hole 16 and at least one second opening for thinning operation. The dimension of the first opening is 0.5 μm□ and the dimension of the second opening is 3 μm□.

Figure 5:
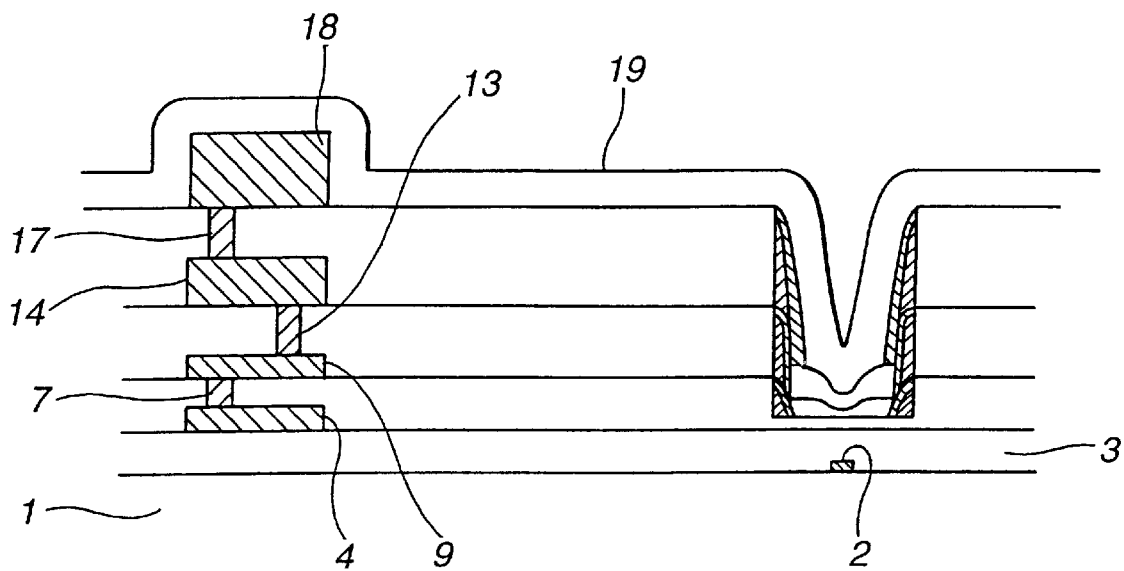
FIG. 5 is a cross-sectional view showing the structure of FIG. 4, and a fourth wiring layer covered with a protective film.

Referring to FIG. 5, a plug 17 filling the hole 16 is formed in the same manner as the formation of the plug 7. A fourth Al wiring layer 18 is formed on the insulator film 15 in the same manner as the formation of the second Al wiring layer 9. The thickness of the fourth wiring layer 18 is 1.6 μm. The patterning to form the fourth wiring layer 18 should involve over etching to remove all of Al from the bottom of the recessed portion above the fuse link 2. A protective film 19 of SiON is formed over the entire surface of the fourth wiring layer 18 and the insulator film 15 by plasma CVD. The thickness of the protective film 19 is 0.8 μm.

Figure 6:
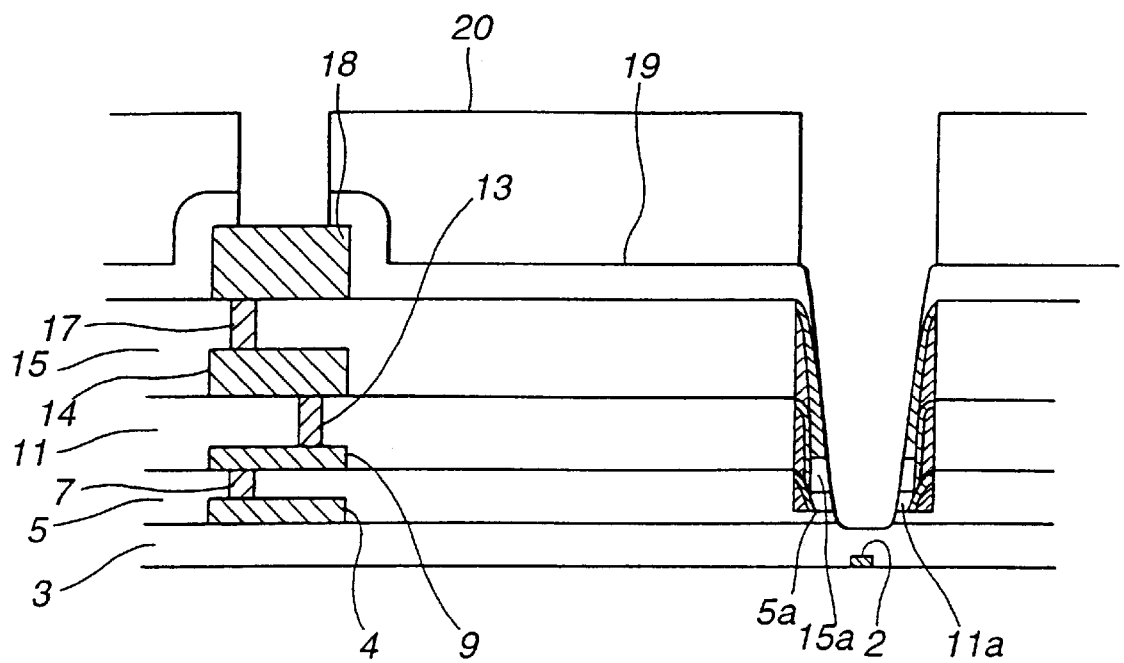
FIG. 6 is a cross-sectional view showing the structure of FIG. 5 with a photoresist over the protective film, after a portion of the protective film above the fuse has been removed together with the remaining material above the fuse upon etching an aperture to expose a pad of the fourth wiring layer.

Referring to FIG. 6, a photoresist 20 is used as a mask positioning over the protective film 19. The mask has at least one opening for forming an aperture through the protective film 19 above the pad of the fourth wiring layer 18 and at least one second hole for removing a portion of the protective film 19 above the fuse link 2. Using the photoresist 20 as the mask, dry etching technique is used to etch a portion of the protective film 19 to expose the pad of the fourth wiring layer 18 and the portion of the protective film 19 above the fuse link 2. Upon the dry etching, the remaining portions 15a, 11a and 5a of the insulator films 15, 11 and 5 above the fuse link 2 are etched. Further, a portion of the insulator film 3 above the fuse link 2 is over etched to provide a thinned film of about 0.8 μm in thick above the fuse link 2.

An electrical testing is conducted after contacting an electric probe with the pad through the aperture to measure its property. Then, the result of the testing is used to determine a target fuse link to be blown. Laser energy is focused through the thinned portion of the insulator film 3 to the target fuse link 2 to blow it. After the target fuse link 2 has been opened, the property testing is conducted. After such testing, the multiple layered structure is subject to various necessary processes to become a LSI semiconductor device.

According to this preferred embodiment, the portions of the insulator films 5, 11 and 15 have been thinned upon etching through holes. The total thickness of films after forming the protective film 19 above the fuse link 2 is thin. Thus, the photoresist 20 can withstand as the mask over the entire time required for etching to thin the remaining films above the fuse link 2 because the entire time is not too long.

According to the preferred embodiment, all of the insulator films 5, 11 and 15 are etched at portions above the fuse link 2 upon etching though holes through these insulator films. Within the withstand limit of the photoresist for etching through hole, each of the insulator films 5, 11 and 15 is over etched to provide an appropriately thinned portion above the fuse link 2. Over etching needed upon opening apertures through the protective film can be completed within a period of time during which the photoresist can withstand.

According to the preferred embodiment, each of the insulator films 5, 11 and 15 is etched at a portion above the fuse link 2 upon etching through holes. The present invention is not limited to this. The present invention may involve a variation in which some of such insulator films are selected and subject to etching upon forming through holes. The selection may be made to provide as a result a required level of thinned portion above the fuse link 2. The degree of etching for thinning may be stopped at the depth of the through hole. Alternatively, within the withstand limit of the photoresist. The insulator film may be over etched to completely remove the film or to partially remove the insulator film underneath in addition to the complete removal.

While the present invention has been particularly described, in conjunction with a preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A process of making a multiple layered wiring structure, comprising:
   providing at least one fuse within an area portion of a film over a substrate;
   forming a plurality of wiring layers over the remaining area portion of said film, such that each said wiring layer is separated by an insulator film;
   forming, by etching, at least one hole through said insulator film for establishing an electrical interconnection between the adjacent two wiring layers separated by said insulator film;
   removing, by etching, at least partially said insulator film at a portion above said fuse upon said forming at least one hole;
   forming a protective film over said plurality of wiring layers;
   forming, by dry etching using a photoresist as a mask, at least one aperture through said protective film to expose a pad of the adjacent wiring layer beneath said protective film;
   removing said protective film at a portion above said fuse upon said forming said at least one aperture through said protective film;
   conducting testing by contacting an electrical probe with said pad; and
   focusing laser energy to said fuse in response to result from said conducting testing.

2. The process as claimed in claim 1, wherein each insulator film is made of a dielectric material and the dielectric material is removed through a plurality of said insulator films upon said removing, by etching, said portion of each insulator film above said fuse.

3. The process as claimed in claim 2, wherein at least one insulator film results from polishing a surface a film produced after deposition of the material.

4. The process as claimed in claim 2, further comprising removing, by etching using said photoresist as a mask, at least partially the remaining portions of said insulator films above said fuse after said removing said protective film at the portion above said fuse.

5. The process as claimed in claim 3, further comprising removing, by etching using said photoresist as a mask, at least partially the remaining portions of said insulator films above said fuse after said removing said protective film at the portion above said fuse.

6. The process as claimed in claim 1, wherein at least one insulator film results from polishing a surface of a film produced after deposition of the dielectric material.

7. The process as claimed in claim 6, further comprising removing, by etching using said photoresist as a mask, at least partially the remaining portions of said insulator films above said fuse after said removing said protective film at the portion above said fuse.

8. The process as claimed in claim 1, further comprising removing, by etching using said photoresist as a mask, at least partially the remaining portions of said insulator films above said fuse after said removing said protective film at the portion above said fuse.

9. In a process of making a multiple layered wiring structure, comprising:
   providing at least one fuse in a film of dielectric material within an area portion thereof;
   forming a plurality of wiring layers over the remaining area portion of said film such that each said wiring layer is separated by dielectric material;
   etching at least one hole through a portion of said dielectric material for establishing an electrical interconnection between the adjacent two wiring layers separated by said portion of said dielectric material;
   etching at least partially a portion of said dielectric material above said fuse upon said etching at least one hole;
   forming a protective film over said plurality of wiring layers;
   etching at least one aperture through said protective film to expose a pad of the adjacent one of said wiring layers underneath said protective film; and
   etching a portion of said protective film above said fuse upon said forming said at least one aperture through said protective film.

10. In a process of making a multiple layered wiring structure, comprising:
   providing at least one fuse in a film of dielectric material with an area portion thereof;
   forming a plurality of wiring layers over the remaining area portion of said film such that each said wiring layer is separated by dielectric material;
   etching, using a first mask, at least one hole through a portion of said dielectric material for establishing an electrical interconnection between the adjacent two wiring layers separated by said portion of said dielectric material;
   etching at least partially a portion of said dielectric material above said fuse upon said etching at least one hole;
   forming a protective film over said plurality of wiring layers;
   etching, using a second mask, at least one aperture through said protective film to expose a pad of the adjacent one of said wiring layers underneath said protective film;
   etching a portion of said protective film above said fuse upon said etching said at least one aperture through said protective film; and
   etching, using said second mask, the dielectric material above said fuse.

* * * * *